(12) United States Patent
Park

(10) Patent No.: US 7,177,064 B2
(45) Date of Patent: Feb. 13, 2007

(54) DISPLAY DEVICE USING PRINTED CIRCUIT BOARD AS SUBSTRATE OF DISPLAY PANEL

(75) Inventor: Kee Yong Park, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 11/145,413

(22) Filed: Jun. 6, 2005

(65) Prior Publication Data
US 2005/0275923 A1    Dec. 15, 2005

(30) Foreign Application Priority Data
Jun. 11, 2004 (KR) ............... 10-2004-0043049

(51) Int. Cl.
G02F 1/153 (2006.01)
G02F 1/15 (2006.01)
G09G 3/28 (2006.01)
G09G 3/36 (2006.01)
G09G 3/38 (2006.01)

(52) U.S. Cl. .................. 359/270; 359/265; 345/60; 345/88; 345/44; 345/104; 345/105; 345/182; 345/204; 345/214; 345/149; 345/152

(58) Field of Classification Search ........... 359/265, 359/270, 272, 275; 345/44, 60, 88, 96, 97, 345/104, 105, 182, 204, 214, 904; 349/12, 349/40, 41, 29, 137, 141, 149, 150, 152; 313/495, 500
See application file for complete search history.

(56) References Cited
U.S. PATENT DOCUMENTS 4,426,643 A * 1/1984 Martin .................. 345/214
4,549,174 A * 10/1985 Funada et al. ............ 349/150
4,758,896 A * 7/1988 Ito ........................... 348/790
5,430,462 A * 7/1995 Katagiri et al. ........... 345/104
6,714,335 B2 * 3/2004 Athenstaedt et al. ....... 359/267
6,774,872 B1 * 8/2004 Kawada et al. ............ 345/60
6,961,111 B1 * 11/2005 Kuramasu ................. 349/152

FOREIGN PATENT DOCUMENTS

JP    11-500838    1/1999
KR    10-2000-33860    6/2000

* cited by examiner

Primary Examiner—Loha Ben
(74) Attorney, Agent, or Firm—McKenna Long & Aldridge LLP

(57) ABSTRACT

Disclosed is a display device using a printed circuit board (PCB) as a substrate of a display panel. The display device includes the PCB formed with a via hole, a display panel having an electrode aligned adjacent to one side of the via hole formed in the PCB in order to apply an electric signal to a pixel or a segment, a driving circuit section for applying an electric signal to the display panel, and a wiring section for electrically connecting the electrode of the display panel to the driving circuit section through the via hole. The electric signal of the driving circuit is directly applied to the lower electrode through the via hole of the PCB, so the length of the electrode line used for wiring can be significantly reduced, thereby improving the response speed of the display device.

14 Claims, 4 Drawing Sheets

DISPLAY DEVICE USING PRINTED CIRCUIT BOARD AS SUBSTRATE OF DISPLAY PANEL

CROSS-REFERENCE TO RELATED APPLICATIONS

This application claims the benefit of Korean Patent Application No. 10-2004-43049, filed Jun. 11, 2004 in Korea, which is hereby incorporated by reference in its entirety.

BACKGROUND OF THE INVENTION

1. Field of the Invention

The present invention relates to a display device using a printed circuit board (PCB) as a substrate of a display panel. More particularly, the present invention relates to a display device capable of improving the response speed and image quality thereof by directly connecting pixels or segments of a display panel to a driving circuit through a via hole formed in a PCB.

2. Description of the Prior Art

Generally, display devices are classified into emissive display, such as CRTs, PDPs, LEDs, or OLEDs, and non-emissive display, such as LCDs. The emissive display represents the high response speed, but the image becomes faint in a bright place. In contrast, the non-emissive display represents the low response speed although it can clearly display the image in the bright place.

Among other things, an electrochromic display (ECD) is a non-emissive display, such as an LCD, capable of adjusting the color of an electrochromic material through controlling the chemical reaction of the electrochromic material by applying an electric signal to the electrochromic material.

FIG. 1 is a schematic view illustrating a structure of a display panel of an ECD. Referring to FIG. 1, the display panel 1 of the ECD includes a lower electrode 11 formed on a lower glass substrate 10, an electrochromic layer 12 formed on an upper surface of the lower electrode 11 and including an electrochromic material changing its color depending on an electric signal applied thereto, an electrolyte layer 13 formed on the electrochromic layer 12 and including ions related to the electrochromic reaction, an ion storage 14 formed on the electrolyte layer 13 for storing ions having polarity opposite to that of the ions related to the electrochromic reaction, an upper electrode 15 formed on the ion storage 14, and an upper glass substrate 16 formed on the upper electrode 15. Generally, at least one of the lower electrode 11 and the upper electrode 15 is a transparent electrode, such as indium tin oxide (ITO) electrode. The ion storage 14 can be omitted and the electrolyte layer 13 can be replaced with an ionic liquid layer including ionic liquid.

If voltage is applied to the display panel 1, current flows from the electrochromic layer 12 to the ion storage 14, thereby coloring the electrochromic layer 12. In contrast, if the current flows from the ion storage 14 to the electrochromic layer 12, the electrochromic layer 12 is decolored. The above coloring and decoloring reactions of the electrochromic layer 12 may occur with the current flow inverse to the above current flow depending on materials of the electrochromic layer 12.

FIG. 2a is a view illustrating a layout of the electrochromic layer for displaying numerical characters with 7-segments, and FIG. 2b is a view illustrating a layout of a conventional lower electrode for applying an electric signal to the electrochromic layer shown in FIG. 2a.

As shown in FIG. 2b, lengths of electrodes corresponding to segments are different from each other. In general, an electrode resistance value (for example, 200 Ω) of a segment (a) is higher than an electrode resistance value (for example, 100 Ω) of a segment (d) by two times. In this case, the maximum current for the segments (d and a) is 10 mA and 5 mA, respectively, under the same coloring voltage of 1.0V, so the response speed of the segment (a) is slower than the that of the segment (d) by two times. Accordingly, the overall response speed of the display device may be slowered while varying the coloring degree for each segment, thereby degrading the image quality of the display device.

The above problem may occur in various display devices in addition to the ECD. For instance, display devices, such as the LCDs, OLEDs or PDPs, have wirings on each pixel electrode for applying an electric signal to a display panel. In this case, the line width becomes narrowed as the number of pixels increases, thereby increasing the resistance. Accordingly, the response speed of the display device is slowered and the non-uniformity of the pixel image is occurred.

SUMMARY OF THE INVENTION

The present invention is directed to a display device using a printed circuit board (PCB) as a substrate of a display panel that substantially obviates one or more problems due to limitations and disadvantages of the related art.

It is an object of the present invention to provide a display device capable of improving operational characteristics thereof by reducing resistance of electrodes through directly applying an electric signal to pixels or segments of a display panel by way of a via hole formed in a PCB.

To achieve this object and other advantages in accordance with the purpose of the invention, as embodied and broadly described herein, there is provided a display device comprising: a printed circuit board (PCB) formed with a via hole and used as a substrate; a display panel having an electrode, which applies an electric signal to a pixel or a segment, aligned adjacent to one side of the via hole formed in the PCB; a driving circuit section for applying an electric signal to the display panel; and a wiring section for electrically connecting the electrode of the display panel to the driving circuit section through the via hole.

According to one preferred embodiment of the present invention, the driving circuit section is formed in the PCB in opposition to the display panel.

According to another preferred embodiment of the present invention, the display device further includes an electrochromic layer aligned on the electrode in such a manner that a color thereof is changed according to the electric signal applied thereto from the electrode, an electrolyte layer aligned on the electrochromic layer and including ions related to an electrochromic reaction, an ion storage, which stores ions having polarity opposite to that of ions related to the electrochromic reaction, aligned on the electrolyte layer, and a second electrode aligned on the ion storage. The ion storage can be omitted and the electrolyte layer can be replaced with an ionic liquid layer including ionic liquid.

According to further another preferred embodiment of the present invention, the via hole includes a metal wiring section formed at an outer peripheral portion of the via hole, and an inner peripheral portion of the via hole is empty or filled with a metal or a PCB laminate material.

According to further another preferred embodiment of the present invention, the display device further includes a passivation layer formed at a connection part between the PCB and the electrode. The passivation layer includes an oxide layer or a nitride layer.

According to the present invention, the electric signal of the driving circuit is directly applied to the electrode through the via hole of the PCB, so the length of the electrode line used for wiring can be significantly reduced, thereby improving the response speed of the display device.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 2b is a view illustrating a layout of a conventional lower electrode for applying an electric signal to an electrochromic layer shown in FIG. 2a.

Figure 1:
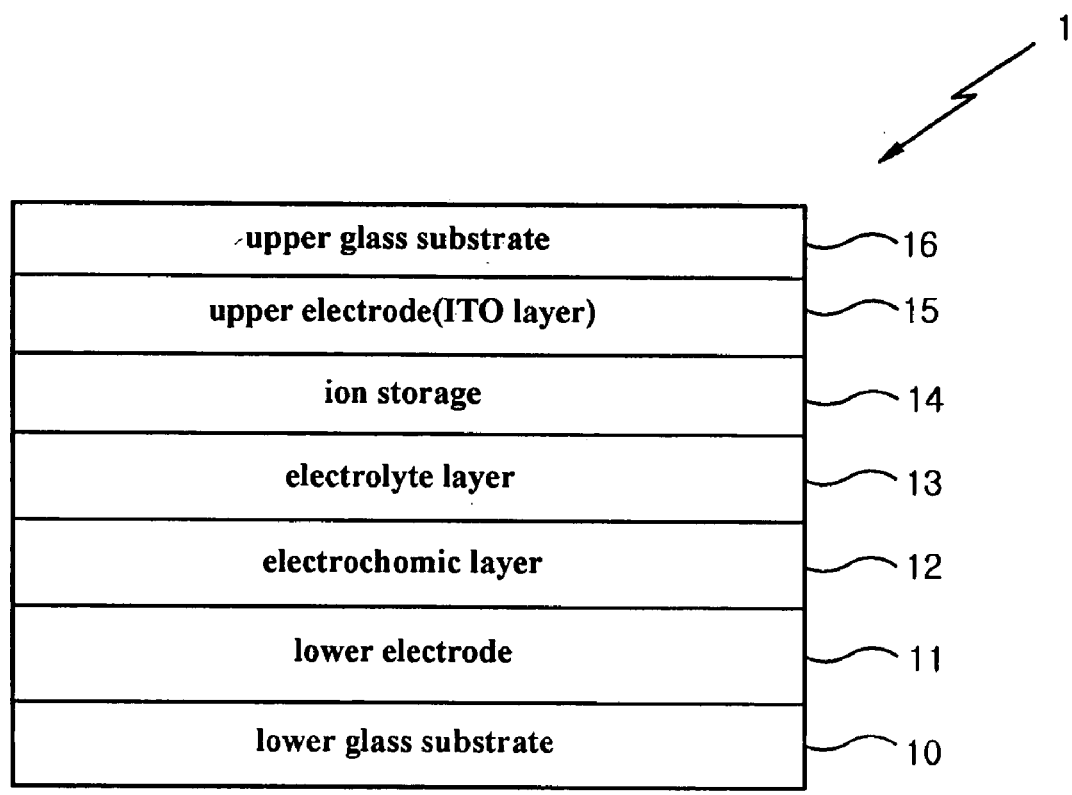
FIG. 1 is a schematic view illustrating a basic structure of a display panel of an ECD.

DESCRIPTION OF REFERENCE NUMERALS
IN THE DRAWINGS

| 20: display panel, | 21: lower electrode |
|---|---|
| 22: electrochromic layer | 23: electrolyte layer |
| 24: ion storage | 25: upper electrode |
| 30: PCB | 32: via hole |
| 34: metal wiring | 36: driving circuit section |
| 50: passivation layer | |

DETAILED DESCRIPTION OF THE
PREFERRED EMBODIMENTS

Reference will now be made in detail to the preferred embodiment of the present invention, examples of which are illustrated in the accompanying drawings. Wherever possible, the same reference numbers will be used throughout the drawings to refer to the same or like parts.

Figure 3:
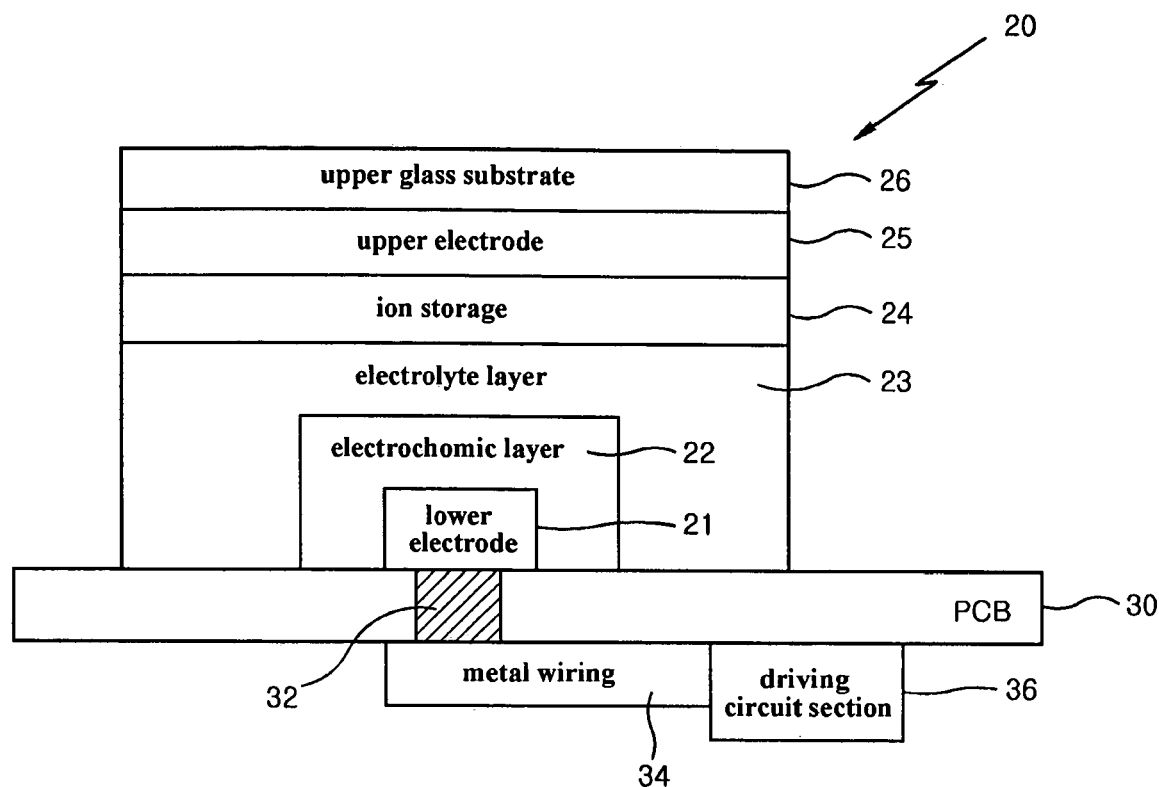
FIG. 3 is a schematic view illustrating a structure of a display device using a PCB as a substrate of a display panel according to a preferred embodiment of the present invention.

FIG. 3 is a schematic view illustrating a structure of a display device using a PCB as a substrate of a display panel according to a preferred embodiment of the present invention.

Referring to FIG. 3, a display panel 20 of an ECD is mounted on a PCB 30. The PCB 30 is a double-side PCB provided at a lower surface thereof with a driving circuit section 36. An electric diving signal generated from the driving circuit section 36 is directly applied to a lower electrode 21 of the display panel by way of a wiring 34 and a via hole 32.

Electronic parts of the driving circuit section 36 can be formed in a separate PCB such that they are electrically connected to the wiring 34 without directly making contact with the PCB 30. This structure is also within the scope of the present invention.

The structure of the display panel 20 shown in FIG. 3 corresponds to the structure of the display panel 1 shown in FIG. 1. That is, a lower electrode 21, an electrochromic layer 22, an electrolyte layer 23, an ion storage 24, an upper electrode 25, and an upper glass structure 26 of the display panel 20 are identical to those of the display panel 1 shown in FIG. 1.

However, according to the present invention, the lower electrode 21 is directly connected to the via hole 32 without forming the lower glass substrate 10 (see, FIG. 1) between the display panel 20 and the PCB 30. In addition, the via hole 32 is electrically connected to the wiring 34.

Figure 2A:
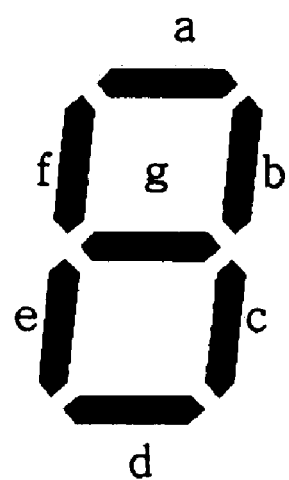
FIG. 2a is a view illustrating a layout of an electrochromic layer for displaying numerical characters with 7-segments.
Figure 2B:
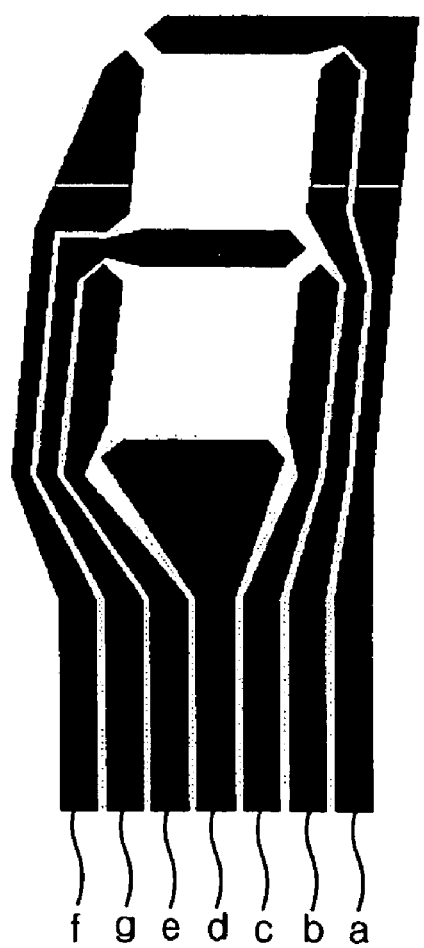

According to the above structure, the lower electrode can be formed with a shape identical to the shape of the electrochromic layer. For instance, in a case of a 7-segment display, the conventional electrochromic layer has a shape as shown in FIG. 2a and the conventional lower electrode has a shape as shown in FIG. 2b by taking the wiring into consideration. However, according to the structure of the display device shown in FIG. 3, the wiring is directly connected to the lower electrode 21 through the via hole 32 from the lower surface of the PCB 20. Thus, the lower electrode 21 can be formed with the shape identical to the shape of the electrochromic layer, so that the length of the electrode wiring can be reduced. As a result, the resistance can be reduced and the response speed of the display device can be improved. In addition, since the segment electrodes are identically formed, the coloring/decoloring of the segments can be uniformly realized.

In one embodiment of the present invention, the upper electrode 25 plays the role of a common electrode. However, it is also possible to employ the lower electrode 22 installed on the upper surface of the PCB 30 as a common electrode.

Preferably, the lower electrode 21 includes a metal electrode. In addition, a transparent electrode (for example, an ITO layer) can be used for the lower electrode 21. If the metal electrode is used as the lower electrode 21, the response speed of the display device can be further improved due to the low resistance value of the metal electrode.

Preferably, the PCB 30 is made from FR4, GETEX, Teflon, or ceramic, but the present invention is not limited thereto. Materials that represent low reactivity with respect to an electrolyte and superior heat-resistant characteristics at device processing temperature can be used for fabricating the PCB 30 without limitations. If the device is processed under the high-temperature condition, it is preferred to use ceramic as a material for the PCB. In addition, a flexible PCB is used for a flexible display.

Preferably, the wiring 34 is made from metal, but the present invention is not limited thereto. Any conductive materials can be used for fabricating the wiring 34 without limitations.

Figure 4:
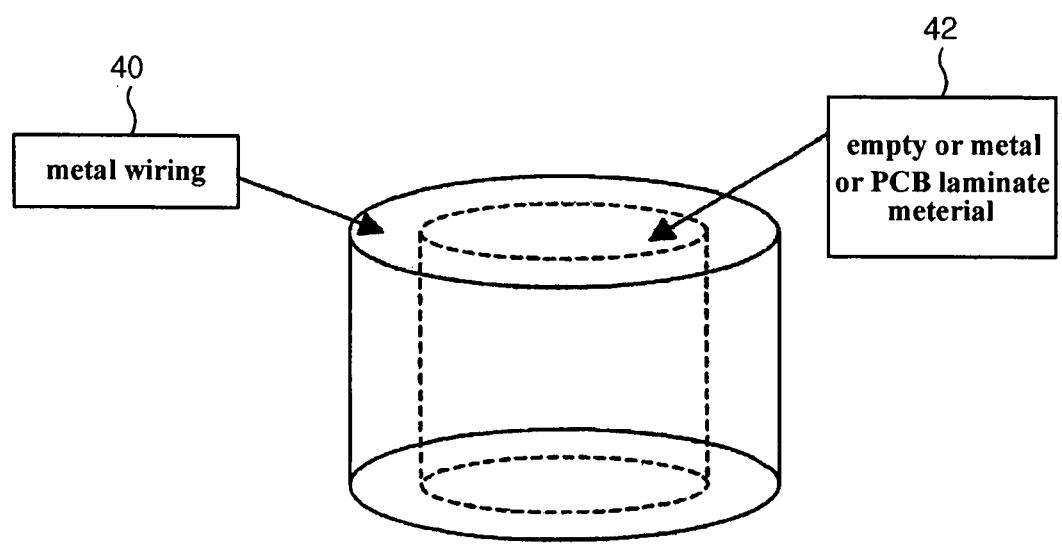
FIG. 4 is a view illustrating a detailed structure of a via hole according to a preferred embodiment of the present invention.

The via hole 32 is provided to electrically connect the lower electrode 21 to the wiring 34. FIG. 4 shows the detailed structure of the via hole 32. Referring to FIG. 4, the via hole 32 includes an outer peripheral portion 40 and an inner peripheral portion 42. The outer peripheral portion 40 is a metal wiring section for electrically connecting the wiring 34 formed at an underside of the PCB 30 to the lower electrode 22. In addition, the inner peripheral portion 42 is a cavity, which is empty or filled with a PCB laminate material or a metal, such as Cu, Au or Pt. Materials filled in the via hole 32 must not react with the electrolyte while preventing the defect caused by a difference of a thermal expansion coefficient between the materials and the PCB 30 or the lower electrode 21 even if the materials are repeatedly shrunk and expanded due to temperature variation. If the inner peripheral portion 42 is filled with the metal or the PCB laminate material, the electrolyte can be prevented from being leaked.

It is also possible to form a passivation layer between the PCB 30 and the electrolyte in order to prevent the chemical reaction therebetween.

Figure 5:
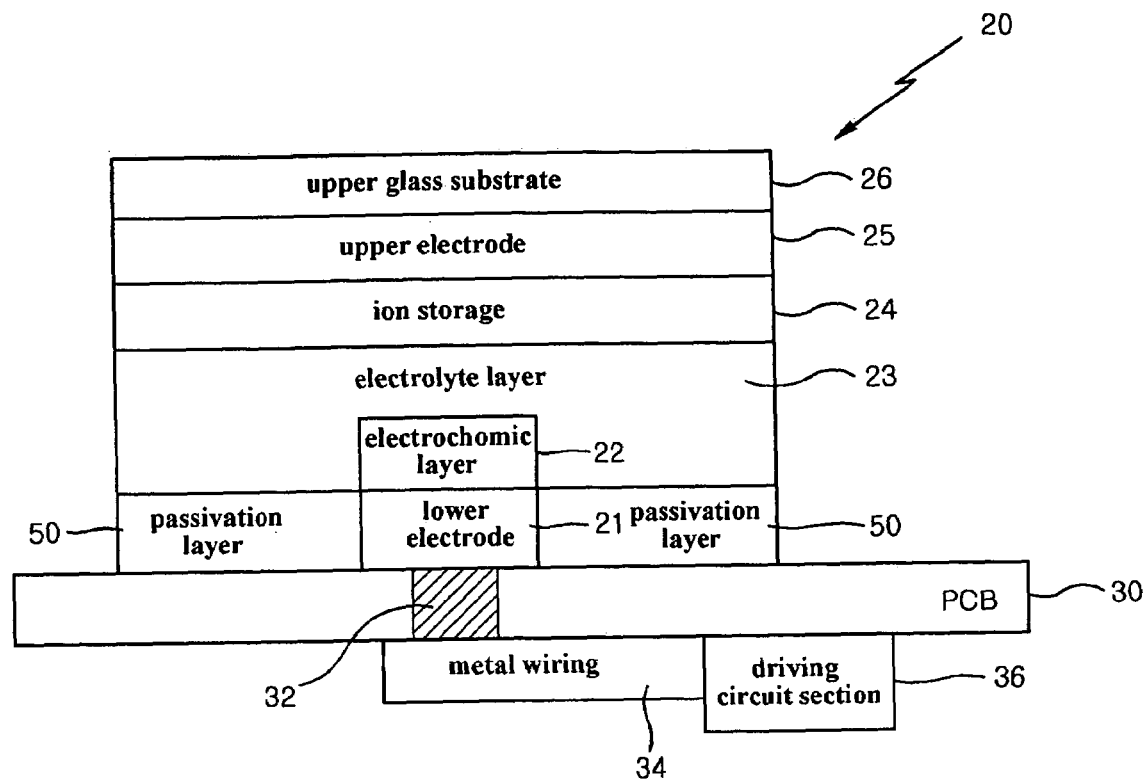
FIG. 5 is a schematic view illustrating a structure of a display device using a PCB as a substrate of a display panel according to another embodiment of the present invention.

FIG. 5 is a schematic view illustrating a structure of a display device using a PCB as a substrate of a display panel according to another embodiment of the present invention.

Figure 6:
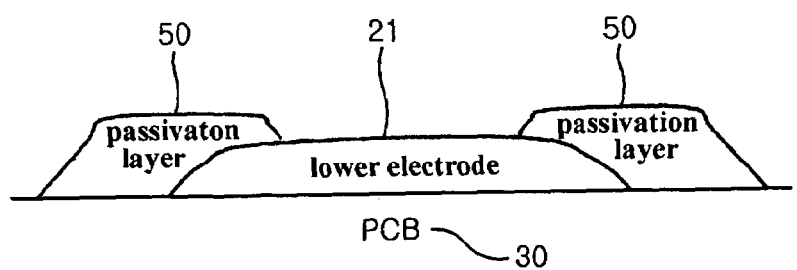
FIG. 6 is a view illustrating a structure of a passivation layer according to a preferred embodiment of the present invention.

Referring to FIG. 5, a passivation layer 50 is further interposed between an electrolyte 23 and a PCB 30 in addition to the structure shown in FIG. 4. Preferably, the passivation layer 30 is made from an oxide layer (for example, $SiO_2$) or a nitride layer (for example, SiN) in such a manner that a connection part between the PCB and the lower electrode is not exposed to the exterior. FIG. 6 shows a structure of the passivation layer in detail.

Although the present invention has been described in relation to the electrochromic device, the present invention is applicable for other display devices. For instance, the present invention is used for an LCD (liquid crystal display), a PDP (plasma display panel), an LED (light emitting diode), an EL (electroluminescent display), an OLED (organic LED), an electrophoretic display, or display devices used for displaying images by applying electric signals to pixel electrodes.

For example, if the present invention is utilized for a passive matrix display device, since the wiring is directly connected to the lower electrode formed on the upper surface of the PCB by passing through the PCB from the lower portion of the PCB, the length of the electrode wiring is significantly reduced and the difference of the resistance values of the pixels can be reduced.

According to the present invention, the electric signal of the driving circuit is directly applied to the lower electrode through the via hole of the PCB, so the length of the electrode line used for wiring can be significantly reduced, thereby improving the response speed of the display device.

In addition, since the pixel electrodes or segment electrodes are uniformly formed, the coloring/decoloring of the pixel electrodes can be uniformly realized, so that the image quality can be improved.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A display device comprising:
   a printed circuit board (PCB) formed with a via hole and used as a substrate;
   a display panel having an electrode, which applies an electric signal to a pixel or a segment, aligned adjacent to one side of the via hole formed in the PCB;
   a driving circuit section for applying the electric signal to the display panel through the electrode; and
   a wiring section for electrically connecting the electrode of the display panel to the driving circuit section through the via hole.

2. The display device as claimed in claim 1, wherein the driving circuit section is formed in the PCB in opposition to the display panel.

3. The display device as claimed in claim 2, wherein the via hole includes a metal wiring section formed at an outer peripheral portion of the via hole, and an inner peripheral portion of the via hole is filled with a metal or a PCB laminate material.

4. The display device as claimed in claim 2, wherein the via hole includes a metal wiring section formed at an outer peripheral portion of the via hole, and an inner peripheral portion of the via hole is empty.

5. The display device as claimed in claim 2, further comprising a passivation layer formed at a connection part between the PCB and the electrode.

6. The display device as claimed in claim 5, wherein the passivation layer includes an oxide layer or a nitride layer.

7. The display device as claimed in claim 1, further comprising an electrochromic layer aligned adjacent to the electrode in such a manner that a color thereof is changed according to the electric signal applied thereto from the electrode, an electrolyte layer aligned adjacent to the electrochromic layer and including ions related to an electrochromic reaction, and a second electrode aligned adjacent to the electrolyte layer.

8. The display device as claimed in claim 7, further comprising an ion storage, which stores ions having polarity opposite to that of ions related to the electrochromic reaction, aligned adjacent to the electrolyte layer.

9. The display device as claimed in claim 1, further comprising an electrochromic layer aligned adjacent to the electrode in such a manner that a color thereof is changed according to the electric signal applied thereto from the electrode, an ionic liquid layer aligned adjacent to the electrochromic layer and including ions related to an electrochromic reaction, and a second electrode aligned adjacent to the ionic liquid layer.

10. The display device as claimed in claim 9, further comprising an ion storage, which stores ions having polarity opposite to that of ions related to the electrochromic reaction, aligned adjacent to the ionic liquid layer.

11. The display device as claimed in claim 1, wherein the via hole includes a metal wiring section formed at an outer peripheral portion of the via hole, and an inner peripheral portion of the via hole is filled with a metal or a PCB laminate material.

12. The display device as claimed in claim 1, wherein the via hole includes a metal wiring section formed at an outer peripheral portion of the via hole, and an inner peripheral portion of the via hole is empty.

13. The display device as claimed in claim 1, further comprising a passivation layer formed at a connection part between the PCB and the electrode.

14. The display device as claimed in claim 13, wherein the passivation layer includes an oxide layer or a nitride layer.

* * * * *